(12) United States Patent
Colonna et al.

(10) Patent No.: US 9,224,708 B2
(45) Date of Patent: Dec. 29, 2015

(54) METHOD FOR MANUFACTURING A CONDUCTING CONTACT ON A CONDUCTING ELEMENT

(71) Applicants: COMMISSARIAT A L'ENERGIE ATOMIQUE ET AUX ENERGIES ALTERNATIVES, Paris (FR); STMICROELECTRONICS SA, Montrouge (FR)

(72) Inventors: Jean-Philippe Colonna, Corenc (FR); Perceval Coudrain, Grenoble (FR)

(73) Assignees: COMMISSARIAT A L'ENERGIE ATOMIQUE ET AUX ENERGIES ALTERNATIVES, Paris (FR); STMICROELECTRONICS S.A., Montrouge (FR)

( * ) Notice: Subject to any disclaimer, the term of this patent is extended or adjusted under 35 U.S.C. 154(b) by 0 days.

(21) Appl. No.: 14/339,630

(22) Filed: Jul. 24, 2014

(65) Prior Publication Data
US 2015/0028488 A1    Jan. 29, 2015

(30) Foreign Application Priority Data
Jul. 25, 2013  (FR) ..................... 13 57328

(51) Int. Cl.
*H01L 23/48*  (2006.01)
*H01L 23/00*  (2006.01)
(Continued)

(52) U.S. Cl.
CPC .......... *H01L 24/19* (2013.01); *H01L 21/30604* (2013.01); *H01L 21/4853* (2013.01); *H01L 21/7685* (2013.01); *H01L 21/76898* (2013.01); *H01L 24/11* (2013.01); *H01L 24/13* (2013.01); *H01L 24/20* (2013.01);
(Continued)

(58) Field of Classification Search
CPC ......... H01L 24/13; H01L 24/11; H01L 24/19; H01L 24/20; H01L 21/76898; H01L 21/4853; H01L 21/30604; H01L 21/7685; H01L 2224/13671; H01L 2224/13076
See application file for complete search history.

(56) References Cited

U.S. PATENT DOCUMENTS 5,618,752 A    4/1997 Gaul
2007/0049016 A1  3/2007 Hiatt et al.
(Continued)

OTHER PUBLICATIONS

French Preliminary Search Report issued Apr. 25, 2014 in French Application 13 57328, filed on Jul. 25, 2013 ( with English Translation of Categories of Cited Documents and Written Opinion).

(Continued)

*Primary Examiner* — A. Sefer
(74) *Attorney, Agent, or Firm* — Oblon, McClelland, Maier & Neustadt, L.L.P.

(57) ABSTRACT

The invention relates to a method for producing an interconnection pad on a conducting element comprising an upper face and a side wall; the method being executed from a substrate at least the upper face of which is insulating; the conducting element going through at least an insulating portion of the substrate, the method being characterized in that it comprises the sequence of the following steps: a step of embossing the conducting element, a step of forming, above the upper insulating face of the substrate, a stack of layers comprising at least one electrically conducting layer and one electrically resistive layer, a step of partially removing the electrically resistive layer, a step of electrolytic growth on the portion of the electrically conducting layer so as to form at least one interconnection pad on said conducting element.

15 Claims, 9 Drawing Sheets

(51) Int. Cl.
*H01L 21/768* (2006.01)
*H01L 21/306* (2006.01)
*H01L 21/48* (2006.01)
*H01L 23/31* (2006.01)
*H01L 21/683* (2006.01)

(52) U.S. Cl.
CPC ........ *H01L 21/6836* (2013.01); *H01L 23/3171* (2013.01); *H01L 2224/11462* (2013.01); *H01L 2224/11472* (2013.01); *H01L 2224/1308* (2013.01); *H01L 2224/13009* (2013.01); *H01L 2224/1356* (2013.01); *H01L 2224/13076* (2013.01); *H01L 2224/13082* (2013.01); *H01L 2224/13084* (2013.01); *H01L 2224/13144* (2013.01); *H01L 2224/13147* (2013.01); *H01L 2224/13166* (2013.01); *H01L 2224/13171* (2013.01); *H01L 2224/13181* (2013.01); *H01L 2224/13186* (2013.01); *H01L 2224/13565* (2013.01); *H01L 2224/13582* (2013.01); *H01L 2224/13583* (2013.01); *H01L 2224/13644* (2013.01); *H01L 2224/13647* (2013.01); *H01L 2224/13666* (2013.01); *H01L 2224/13671* (2013.01); *H01L 2224/13681* (2013.01); *H01L 2224/13686* (2013.01); *H01L 2224/14181* (2013.01); *H01L 2924/01022* (2013.01); *H01L 2924/01024* (2013.01); *H01L 2924/01029* (2013.01); *H01L 2924/01073* (2013.01); *H01L 2924/01079* (2013.01); *H01L 2924/15788* (2013.01)

(56) References Cited

U.S. PATENT DOCUMENTS

| | | |
|---|---|---|
| 2009/0149023 A1 | 6/2009 | Koyanagi |
| 2010/0096738 A1 | 4/2010 | Simmons-Matthews et al. |
| 2010/0171197 A1 | 7/2010 | Chang et al. |
| 2010/0230794 A1 | 9/2010 | Li et al. |
| 2011/0079900 A1 | 4/2011 | Hiatt et al. |
| 2011/0195544 A1* | 8/2011 | Bachman et al. ............. 438/108 |
| 2011/0272822 A1 | 11/2011 | Li et al. |
| 2013/0001799 A1* | 1/2013 | Chang et al. .................. 257/774 |
| 2013/0099384 A1 | 4/2013 | Simmons-Matthews et al. |

OTHER PUBLICATIONS

P. Coudrain et al. "Towards Efficient and Reliable 300mm 3D Technology for Wide I/O Interconnects", EPTC, 2012, 6 pages.

* cited by examiner

METHOD FOR MANUFACTURING A CONDUCTING CONTACT ON A CONDUCTING ELEMENT

FIELD OF THE INVENTION

The present invention relates to a scheme of three-dimensional integration of systems on several levels, where different components are stacked and interconnected using vertical vias, going through the stages of a substrate. The present invention more particularly relates to forming interconnection pads from said through vias or conducting elements.

The invention applies to the industry of microelectronics which covers the techniques of microelectronics as well as nanoelectronics.

TECHNOLOGICAL BACKGROUND

In order to follow the constant evolution of the microelectronics industry aiming at a significant reduction in the dimensions of the devices, a three-dimensional (3D) integration method has been adopted. In addition to enabling a significant increase in the circuit performances and a reduction in the power consumption thereof, 3D integration makes it possible to reduce the production costs too. This is true provided sufficiently mature and technologically strong 3D methods exist.

The application of the present invention relates to a 3D integration having a high density of interconnections. A 3D integration method may be broken down into three distinct parts: a first part corresponding to the production of conducting elements or through vias (or TSV, for <<Through-Silicon Vias>> or <<TGV>> for <<Through-Glass Vias>>), a second part corresponding to the production of the interconnections, and eventually a third part corresponding to die bonding.

The present invention mainly relates to the production of interconnection pads. Advantageously, wafers comprising a substrate, specifically made of silicon, whereon the devices have been executed with a technology of the <<vias first>> or <<vias middle>> type are used. In the so-called <<vias middle>> technology, the vias conducting elements have very small dimensions, which makes it possible to address applications requiring a higher density of interconnections. The <<vias first>> technology, still under development, will provide, in the longer run, greater possibilities of integration, and may be adapted to very high applicative constraints (reinforced insulations, high voltages).

The <<rear face>> technology further executed on these wafers starts, for example, with a temporary sticking on a silicon or glass substrate, or any other technique making it possible to thin the rear face of the wafers with vias conducting elements. The thinning of the wafers with vias conducting elements is conventionally executed by polishing or rectification (<<grinding>>), followed by a step of releasing the constraints for example by chemical-mechanical polishing (CMP). The step of <<grinding>> thus consists in thinning the wafers with vias conducting elements from the rear face and stops a few microns above the rear of the vias conducting elements (the rear of the vias conducting elements is also called <<copper nails>>). The reveal of the rear of the conducting elements or <<via reveal>> may be executed by mechanical-chemical polishing. However, other techniques exist such as the Reactive-Ion Etching (RIE) or still chemical etching based on tetramethylammonium hydroxide (TMAH) or still a mixture based on hydrofluoric acid and nitric acid ($HF/HNO_3$), for example. The step of <<via reveal>> is executed by etching based on sulphur hexafluoride ($SF_6$), followed by the deposition of a dielectric layer making it possible to insulate the future interconnections from the silicon substrate. It may be a mineral dielectric selected among silicon dioxide ($SiO_2$) or silicon nitride (SiN), which may be deposited by Chemical Vapor Deposition (CVD) or a dielectric resin (<<spin-on>> method). The reveal of the vias conducting elements is then executed by chemical-mechanical polishing. Eventually, the last step consists in executing interconnections called micro-pillars.

The technological steps used to execute such interconnections are first the deposition of a bonding layer or barrier layer, then a second metallic layer having a lower resistivity, or a bilayer based on, for example titanium and copper. A step of lithography used to define the interconnection zones (spreading then development of the resin) is executed next. Then, electrolytic growth of the interconnection pad (made of copper or nickel, for example) is executed. Then, the resin is <<stripped>>. The method ends with etching of the barrier layer, then the metallic layer having a lower resistivity by chemical etching, for example.

Rear face integration is disclosed in the article by P. Coudrain and al., entitled: <<Towards Efficient and Reliable 300 mm 3D Technology for Wide I/O Interconnects>>, published in the <<Proceedings of the Electronics Packaging Technology Conference (EPTC)>>, pp. 335-340, Dec. 5-7, 2012, Singapore.

In the method described above, a step of lithography is executed to define the interconnection zones above TSV conducting elements. Alignment is carried out visually on the TSV conducting elements, for a critical dimension of a few microns.

The drawback of this approach lies in the alignment constraints, during a step of lithography, on micrometric or even nanometric devices. Such inaccuracy in the alignment results both from the technique specific to the positioning of the mask, and also from thermal dilatation effects (different dilatation coefficients between the mask and the silicon substrate).

The step of lithography may also come with compatibility problems between the resin and the electrolytic baths. Such incompatibilities may cause detachment of the resin or modifications in the slope of the resin, resulting in infiltrations into the baths during an Electro-Chemical Deposition (ECD), or adherence problems.

This technique is valid for the present dimensions of TSV which have a diameter of approximately 10 micrometers (micrometer or micron=$10^{-6}$ meter).

Besides, in order to meet the needs relative to devices the dimensions of which are always smaller, finer lithography techniques should be considered. This would be a major change for <<rear face>> integration since the latter would require creating a totally new alignment strategy.

An additional drawback is the multiplicity of associated technological and control steps (spreading of the resin, first annealing, insulation, development, second annealing, stripping the resin, etc.) required by a step of lithography.

The present invention makes it possible to solve all or at least a part of the drawbacks of the present techniques.

SUMMARY OF THE INVENTION

The present invention makes it possible to avoid a step of lithography in the method for producing a conducting pad on a conducting element of the TSV type, and to replace it by the growth of self-aligned interconnections on such conducting elements.

An aspect of the invention relates to a method for producing an interconnection pad on a conducting element comprising an upper face and a side wall; with the method being executed from a substrate at least the upper face of which is insulating; with the conducting element going through at least one insulating portion of the substrate, the method being characterised in that it comprises the sequence of following steps:

a step of embossing the conducting element so configured that the conducting element protrudes beyond the insulating upper face of the substrate, a step of forming above the insulating upper face of the substrate a stack of layers comprising at least one electrically conducting layer and one electrically resistive layer; said electrically resistive layer having a resistivity higher than that of the electrically conducting layer, a step of partially stripping the electrically resistive layer so configured as to reveal at least one access to the electrically conducting layer, positioned above the protruding conducting element a step of electrolytic growth on the portion of the electrically conducting layer, positioned above the conducting element, so as to form at least one interconnection pad on said conducting element.

Thus, an interconnection pad is produced on a conducting element according to one method which, particularly advantageously, is not subjected to the limits met during the steps of lithography, and specifically to alignment tolerances.

Besides and advantageously, the electrically conducting layer remains in position above the conducting element by coating the upper face of the latter, for the step of electrolytic growth. The growth is thus optimised and the end of the conducting element is mechanically protected.

Another aspect of the embodiment of the invention is a microelectronic device which may not restrictively be obtained by implementing at least one of the steps of the method of the invention.

BRIEF INTRODUCTION OF THE FIGURES

The aims, objects, and characteristics and advantages of the invention will be better understood from the detailed description of an embodiment of the latter, which is illustrated by the following appended drawings, wherein:

FIGS. 9 to 15 illustrate the steps of a method according to one exemplary embodiment of the invention, enabling, in particular, to form interconnection pads without any alignment constraint. More precisely:

The drawings are given as examples and do not aim at restricting the invention. They are schematic representations in principle intended to facilitate the understanding of the invention and are not necessarily complying with the scale of practical applications. More particularly, the relative thicknesses of the various layers and films are not representative of reality.

DETAILED DESCRIPTION

It should be noted that, within the scope of the present invention, the word <<on>> does not necessarily mean <<in contact with>>. Thus, for example, the deposition of a layer on another layer does not necessarily mean that both layers are directly in contact with one another but means that one of the layers at least partially covers the other one by being either directly in contact therewith, or by being separated therefrom by a film, or still another layer or another element.

Prior to making a detailed review of the embodiments of the invention, optional characteristics which may be used in association or as alternative solutions are listed hereunder:

The substrate is selected among an insulating substrate or a substrate comprising a dielectric layer on the surface thereof.

The step of embossing the conducting element comprises etching so configured as to strip a thickness of an insulating portion of the substrate corresponding to one height h of the protruding conducting element. Advantageously, depending on the etching agent used, such etching may be isotropic or anisotropic. For example, wet etching will rather be isotropic, whereas dry etching will rather be anisotropic.

The step of forming the stack of layers is so configured that the thickness of the electrically resistive layer is strictly smaller than the height h of the protruding conducting element.

The step of forming the stack of layers is so configured that the thickness of the stack of layers is strictly higher than the height h of the protruding conducting element.

The step of partially removing the electrically resistive layer is self-limited by the detection of an increase in the resisting torque.

A step of completely removing the electrically resistive layer is executed upon completion of the step of electrolytic growth.

The step of completely removing the electrically resistive layer comprises an etching. Advantageously, such etching may be isotropic as well as anisotropic.

A step of removing the electrically conducting layer is executed upon completion of the step of completely stripping the electrically resistive layer.

The step of removing the electrically conducting layer comprises etching. Advantageously, such etching may be isotropic as well as anisotropic.

The stack comprises a bonding layer which is formed on said face of the substrate prior to the step of forming the electrically conducting layer.

A step of removing the bonding layer is executed, upon completion of the step of removing the electrically conducting layer.

The step of removing the bonding layer comprises etching. Advantageously, such etching may be isotropic as well as anisotropic.

The conducting element is surrounded by at least one among a diffusion barrier layer and an insulating layer, with the step of embossing being so configured as to preserve the at least one diffusion barrier layer and one insulating layer in the protruding portion of the conducting element.

Thanks to the invention, production is simplified since it avoids steps of lithography and the efficiency of growth is simultaneously increased while the conducting element is efficiently protected.

Figure 1A:
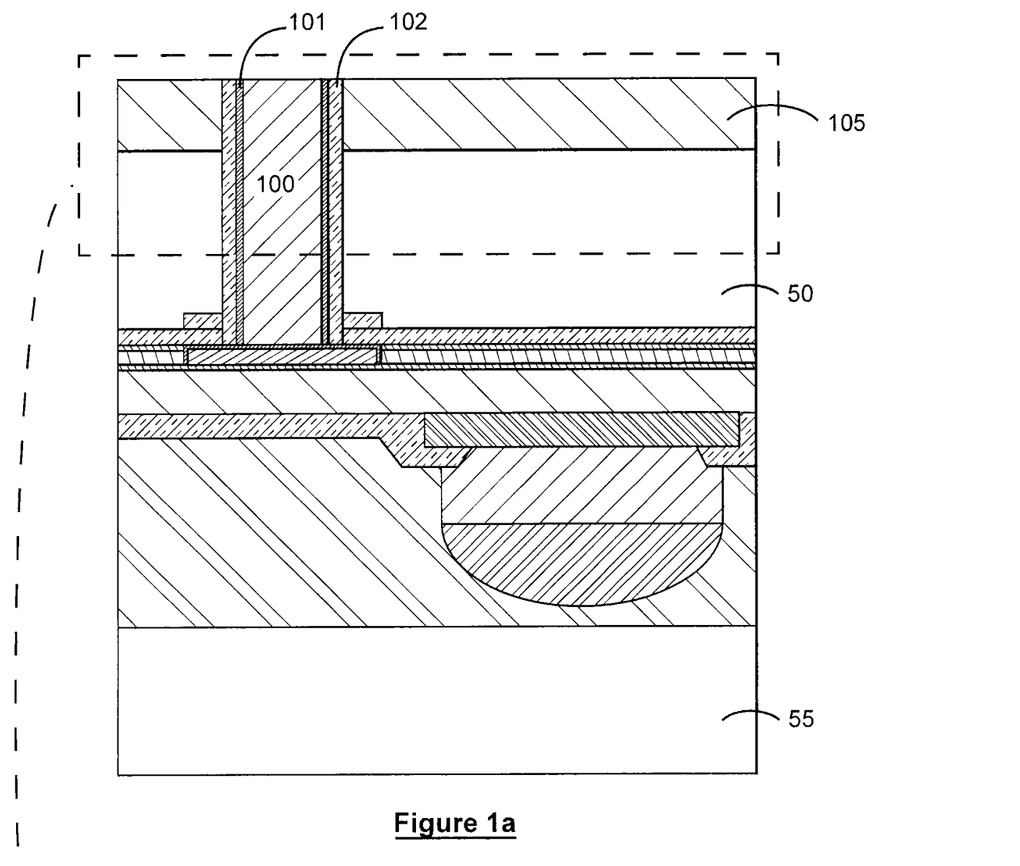
FIGS. 1a and 1b illustrate a representation of a conducting element previously formed from a substrate.

FIG. 1a shows a substrate 50 preferably made of silicon, whereon a conducting element 100 has been produced beforehand specifically according to one technology of the <<vias first>> or <<via middle>> types. The conducting element 100 is preferably made of a central core. This central core is, according to one preferred embodiment, made of a metallic material. It preferably comprises copper. The central core of the conducting element 100 is particularly advantageously coated with a layer acting as a diffusion barrier 101 and an insulating layer 102. As described above, this method requires a certain number of steps.

For very low thicknesses, the wafer comprising the substrate 50 becomes flexible and may break during the thinning operation, before the constraints are released. To remedy this drawback, it is known to stick the substrate 50 to a support handle 55, in order to be able to maintain and handle the thinned substrate 50 without breaking it. The support handle 55 is preferably a silicon or glass substrate. A process of thinning the substrate 50 comprising the conducting element 100 is executed next and is conventionally executed by <<grinding>>. Then, a step of releasing the constraints, for example, by mechanical-chemical polishing is executed. The step of <<grinding>> thus consists in thinning the substrate 50 with the conducting element 100 from the rear face, and stops a few microns above the rear of the conducting element 100, called <<copper nails>>. The reveal at the rear of the conducting element may then be executed preferably by mechanical-chemical polishing or, according to alternative solutions, by etching, for example based on sulphur hexafluoride ($SF_6$), or chemical etching based on tetramethylammonium hydroxide TMAH, or still a mixture based on hydrofluoric acid and nitric acid $HF/HNO_3$.

Forming a dielectric layer 105 enabling to insulate the future interconnections of the substrate 50 is executed next. The layer advantageously made of a dielectric material 105 is deposited on the substrate 50. This dielectric layer 105 may, according to one preferred embodiment, comprise a dielectric mineral selected among silicon dioxide ($SiO_2$), silicon nitride (SiN), etc. Such dielectric has the advantage of being able to be deposited by chemical vapor deposition CVD. In a typical CVD process, the substrate 50 is exposed to one or several gas phase precursor(s), which react(s) and/or decompose(s) on the surface of the substrate 50 to generate the desired deposition. The dielectric layer 105 may, according to another alternative embodiment, comprise a dielectric resin. The dielectric layer 105 is advantageously spread using a centrifugation technique. A spin is used therefor which sucks the wafer comprising the substrate 50 so that it is not ejected and makes it possible, thanks to an adjustment of the rotation and acceleration speed, to uniformly spread the dielectric layer 105. The rotation speed is calculated to obtain a constant thickness on the whole surface.

The step of reveal of the upper face of the conducting element 100 is executed upon completion of the forming of the dielectric layer 105 on the substrate 50. This step is preferably executed by chemical-mechanical polishing.

Figure 1B:
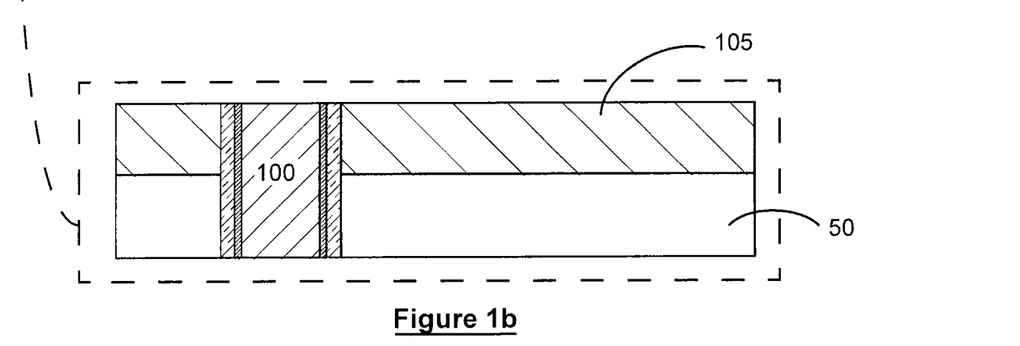

FIG. 1b illustrates a portion of the device comprising the conducting element 100 formed from the substrate 50. The substrate 50 is coated with the dielectric layer 105. The conducting element 100 has a reveal on the upper face, and its side wall is totally in contact with the dielectric layer 105.

The present techniques of production of interconnection pads from conducting elements or through vias (TSV) often use a step of lithography. Such an example of implementation is shown in FIGS. 2 to 8, illustrating the technological steps of the standard method for producing interconnections.

Figure 2:
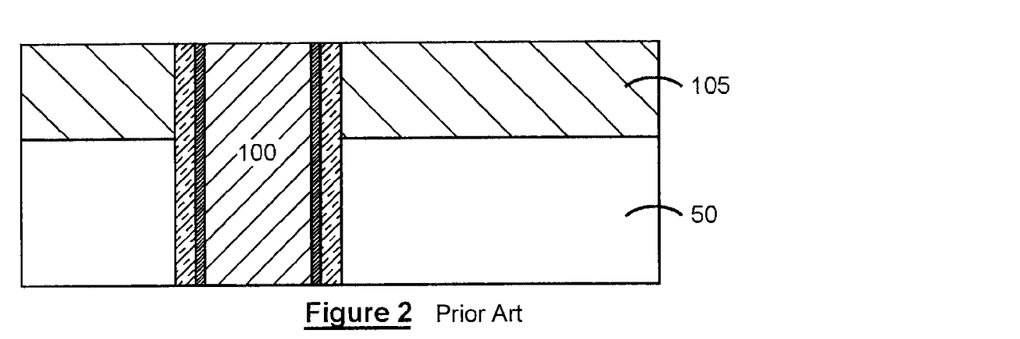
FIGS. 2 to 8 illustrate technological steps of the standard method of production of interconnection pads as per the known technique, and wherein a step of lithography is executed.

FIG. 2 illustrates the substrate 50, comprising the conducting element 100 and a dielectric layer 105, upon completion of the step of reveal of the upper face of the conducting element 100, as described above.

Figure 3:
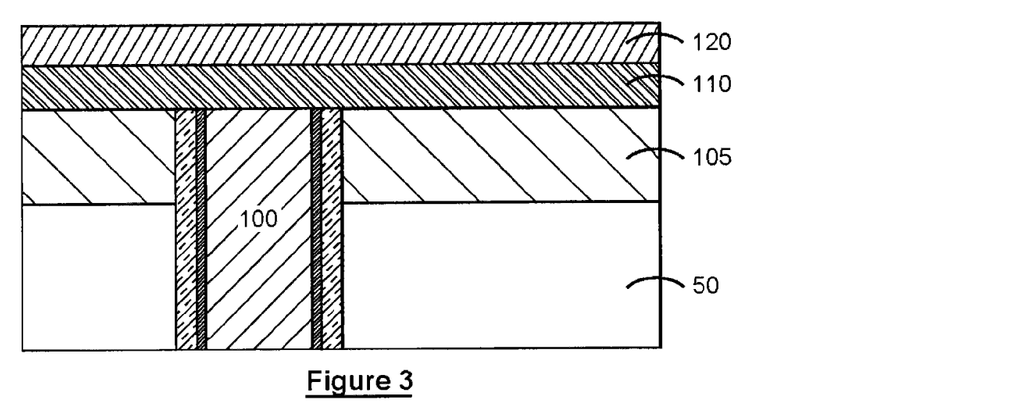

FIG. 3 illustrates the step of forming a first so-called bonding or barrier layer 110 on the dielectric layer 105 and the upper face of the conducting element 100. The bonding layer 110 is preferably metallic and highly adhesive and made of a material, for example, based on titanium (Ti), tantalum (Ta) or chromium (Cr). Forming a layer 120 on the bonding layer 110 is executed next. This layer 120 is preferably metallic. It is made of a material selected among copper (Cu) or gold (Au). The layer 120 has, according to one particularly advantageous embodiment, a much lower resistivity than the first layer 110. For example, the copper layer 120 has a resistivity of approximately $20.10^{-9}$ Ohm/m whereas the titanium bonding layer 110 has a resistivity of approximately $400.10^{-9}$ Ohm/m at a temperature of 300K; this means a factor 20 in difference. The layer 120 may be deposited by evaporation, spraying or chemically.

Figure 4:
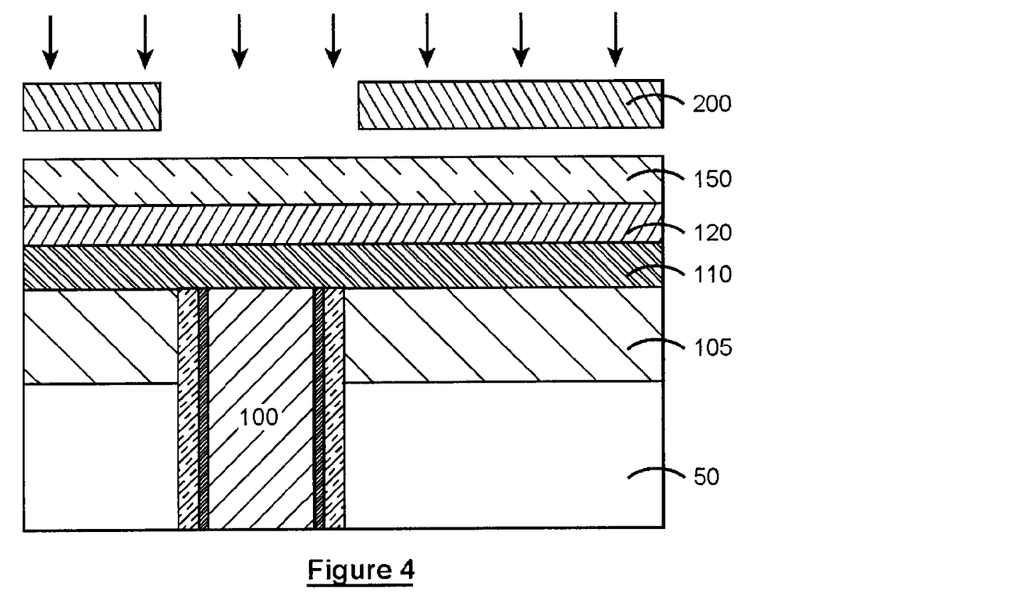

FIG. 4 illustrates a step of lithography consisting first in forming a resin layer 150 on the layer 120. The resin layer 150 is preferably spread on the wafer using a spin, as described above for the forming of the dielectric layer 105.

The resin layer 150 is then dried. Drying makes it possible to obtain a solid layer, through the evaporation of the solvent contained in the liquid resin. A mask 200, comprising patterns, is positioned above the wafer comprising the substrate 50. The mask 200 is so configured as to show patterns above the conducting element 100.

A step of insulating the resin layer 150 through the mask 200 is executed next. Insulation makes it possible to irradiate the layer 120, coated with the photosensitive resin layer 150, through the mask 200, in order to obtain, after uncoating, the patterns of the mask 200 on the layer 120.

Figure 5:
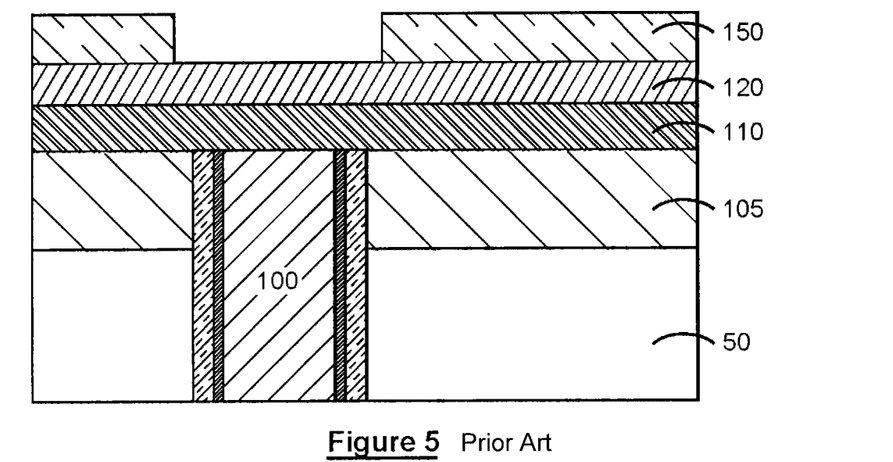

FIG. 5 illustrates the step of uncoating which consists in stripping the resin layer 150 where it has been insulated (i.e. at the patterns of the mask 200). The uncoating substance depends on the resin used. The time of immersion in the solution is defined within one second, and the bath may be homogenised thanks to an automatic stirrer. Preferably, uncoating is stopped by rinsing the sample with deionised water. After rinsing, a step of annealing hardens the resin layer 150 which may, in certain embodiments, resist the chemical etching materials, such as hydrofluoric acid.

Upon completion of such step, patterns are formed above the conducting element 100. The second layer 120 is advantageously uncoated only where the patterns of the mask 200 are located. The rest of the wafer comprising the substrate 50 is coated with the resin layer 150.

Figure 6:
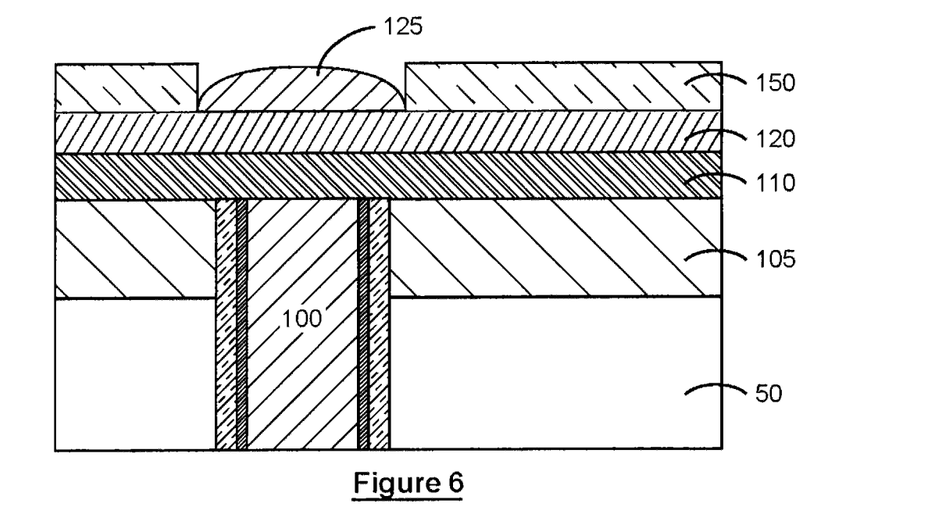

FIG. 6 illustrates the step of electrolytic growth from the layer 120 on the zones whereon the patterns are located. The production of an interconnection pad 125 on the conducting element 100 is executed by electrodeposition. The metal used is preferably copper which has both good electric and thermal conductivity. Electrodeposition is executed in a tank containing an electrolytic bath wherein two electrodes connected to the terminals of a generator are immersed. The electrolytic bath comprises a chemical solution containing positively charged metallic ions. As the electrolytic growth cannot directly occur on the conducting element 100, the latter is advantageously coated beforehand with the highly adhesive metallic bonding layer 110, and the metallic conducting layer 120.

Upon completion of the electrolytic growth, an outgrowth is formed on the surface of the layer 120, corresponding to the interconnection pad 125. Such pad 125 may be made of various materials, for example of fusible materials such as tin-based materials, or not fusible materials such as copper-based materials or materials made of Nickel/Gold alloy. Thus the method does not necessarily require a step of melting the pad 125.

Figure 7:
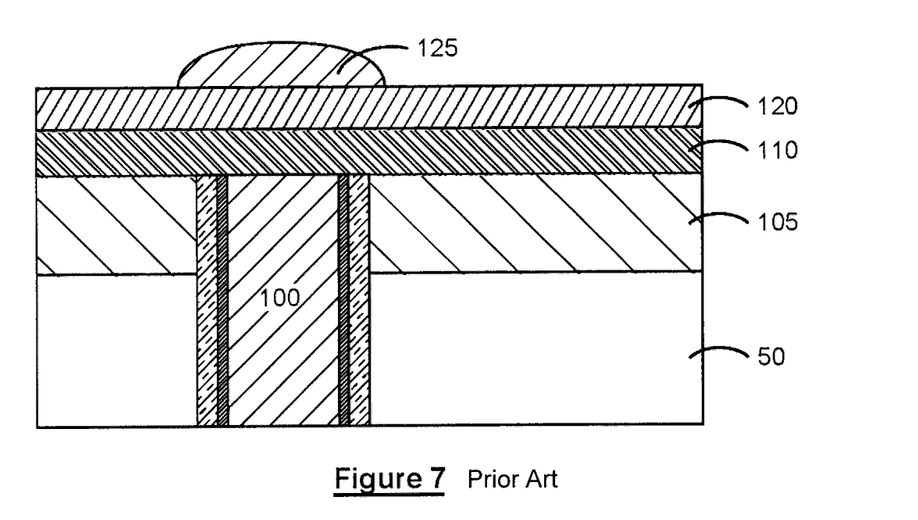

FIG. 7 illustrates the device upon completion of the step of stripping the resin layer 150. The resin layer 150 is so stripped as to uncoat the layer 120. Stripping the resin layer 150 is preferably executed using a chemical solvent such as acetone. Stripping the resin layer 150 does not attack the conducting pad 125.

Figure 8:
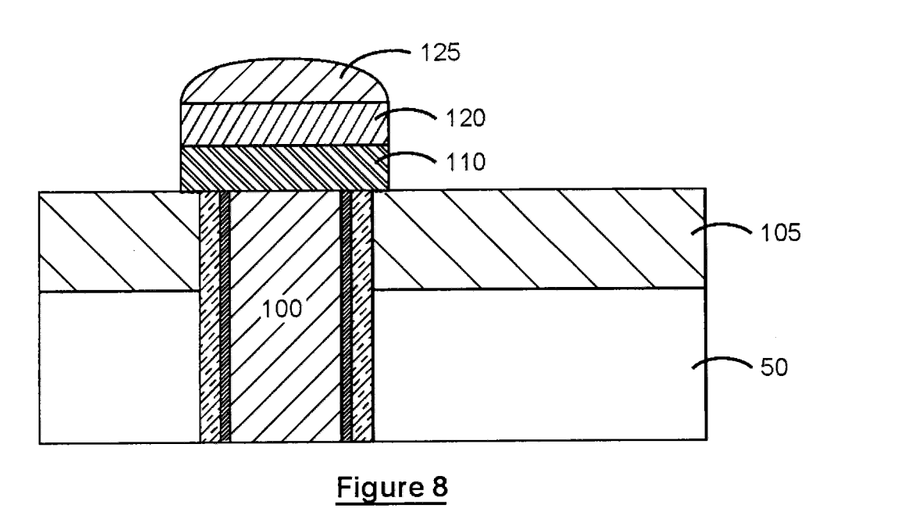

FIG. 8 illustrates the steps of stripping the layer 120, and then the bonding layer 110. The steps of stripping the bonding layer 110 and the layer 120 comprise chemical etching. The step of stripping comprises preferably anisotropic etching.

FIGS. 9 to 15 describe the steps of the method according to the invention for a preferred application which avoids to use the step of lithography described for the prior art and which aims at the production of an interconnection pad 125. Advantageously, the method is aimed at the production of at least one interconnection pad 125.

Figure 9:
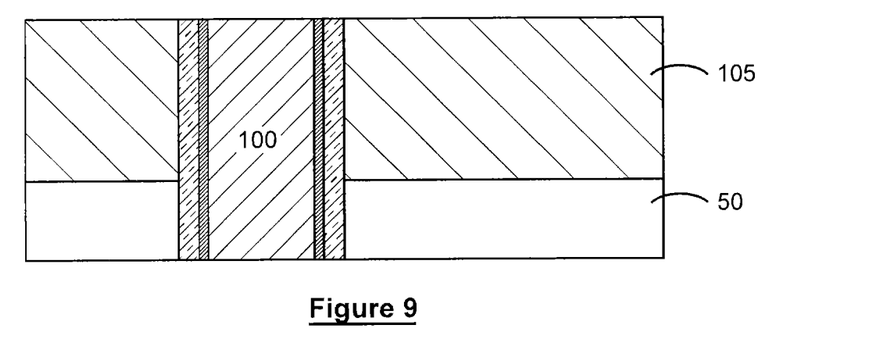
FIG. 9 illustrates a substrate comprising, on the surface thereof, a dielectric layer and a conducting element comprising an upper face and a side wall.

As shown in FIG. 9, a substrate 50, advantageously based on a semi-conductor, more particularly made of silicon (Si), and, preferably, made of silicon only is used. The substrate 50 will preferably be the support whereon a conducting element 100 is preferably provided. Of course, according to the invention, other substrates based on semi-conducting materials could be used and, for example, a silicon substrate on an insulator SOI (SOI), a silicon substrate made of epitaxially grown silicon, etc. The conducting element 100 preferably has a central core. Such central core is, according to one preferred embodiment, made of a metallic material. It preferably comprises copper. The central core of the conducting element 100 is, particularly advantageously coated with a layer acting as a diffusion barrier 101 and an insulating layer 102.

A layer advantageously made of a dielectric material 105 is deposited on the substrate 50. Such dielectric layer 105 may, according to one preferred embodiment, comprise a mineral dielectric selected among silicon dioxide ($SiO_2$), silicon nitride (SiN), etc. Such dielectric layer 105 has the advantage of being able to be deposited by vapor phase deposition. For a mineral dielectric, several deposition techniques can be considered (such as vapor phase deposition, atomic layer deposition or plasma activated atomic layers deposition), but these techniques are not adapted to the thicknesses aimed at in this application which results in an adaptation and thus higher cost. It may also be a spin-coated organic material (polymer).

Figure 10:
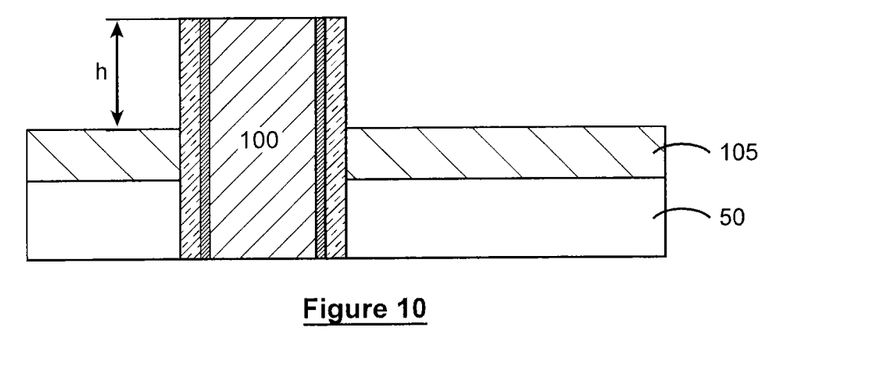
FIG. 10 illustrates a step of embossing the conducting element upon completion of which the conducting element protrudes and goes through the dielectric layer.

FIG. 10 illustrates the step of embossing the conducting element 100 so configured that the conducting element 100 goes through the dielectric layer 105 and protrudes beyond the latter. The step of embossing the conducting element 100 advantageously comprises partially stripping the dielectric layer 105. Such step of embossing the conducting element 100 makes it possible to create a protrusion from said conducting element 100. According to one preferred embodiment, partially stripping the dielectric layer 105 is executed using a chemical solution based, for example, on hydrofluoric acid (HF), when the dielectric layer 105 is made of a material of the silicon dioxide type ($SiO_2$). According to one alternative solution, stripping the dielectric layer 105 is executed using plasma; and, specifically, oxygen plasma when the dielectric layer 105 is made of a material of the polymer type. The step of embossing the conducting element 100 comprises preferably isotropic etching so configured as to strip a thickness of the dielectric layer 105 corresponding to one height h of the protruding conducting element 100.

For a conducting element 100 having a diameter ranging from 0.05 microns to 100 microns. For example, for a via one dimension of which according to the section (generally the diameter) approximately ranges from 5 to 10 microns, the dielectric layer 105, made of a material of the dielectric resin type, may have a thickness ranging from 100 nanometers to 5 microns (nanometer=$10^{-9}$ meter and micrometer or micron=$10^{-6}$ meter). According to this exemplary embodiment, the thickness of the stripped dielectric layer 105, corresponding to one height h of the protruding conducting element 100, ranges from 100 nanometers to 4 microns. The thickness of the stripped dielectric layer 105 is preferably to be adapted to the height of the conducting element 100 and the thickness of the layer which will be deposited afterwards.

According to one particularly advantageous embodiment, the step of embossing the conducting element 100 is so configured as to keep at least one among the layer acting as a diffusion barrier 101 and the insulating layer 102 on the flanks of said conducting element. The etching executed during the step of embossing is thus so configured as to strip the dielectric layer 105 selectively from at least one among the layer acting as a diffusion barrier 101 and the insulating layer 102.

Figure 11A:
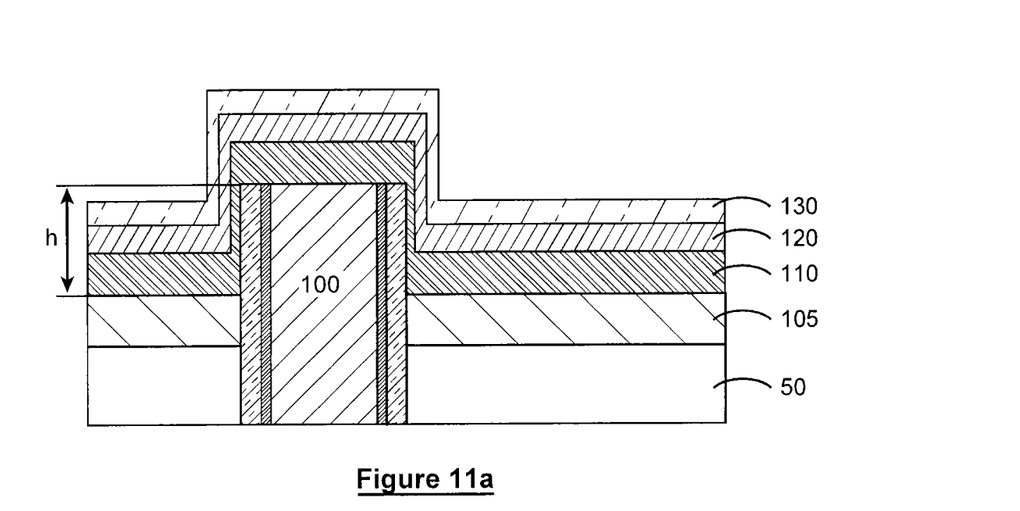
FIGS. 11a and 11b illustrate a step of depositing onto the substrate a successive stack of layers: an optional bonding layer, an electrically conducting layer and an electrically resistive layer.
Figure 11B:
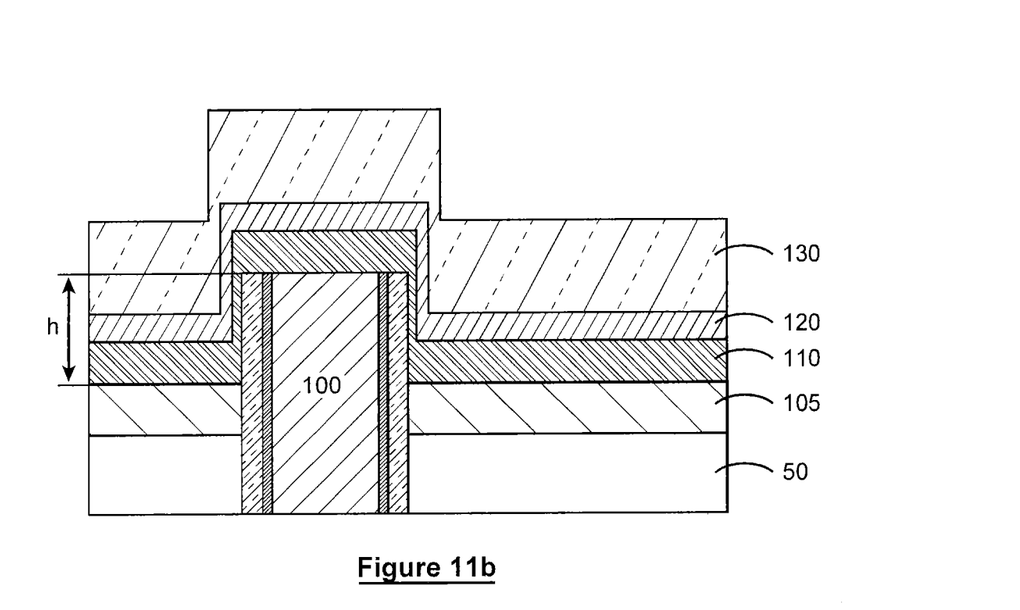

FIGS. 11a and 11b illustrate the steps of forming an electrically conducting layer 120, an electrically resistive layer 130, and, optionally a bonding layer 110.

The electrically conducting layer 120 (or base layer 120) preferably comprises a material selected among copper (Cu), gold (Au) or chromium (Cr). The electrically conducting layer 120 extends on a thickness advantageously ranging from 10 nanometers to 1 micron. Particularly advantageously, the thickness of the electrically conducting layer 120 has to be adjusted according to the desired current density during the step of electrolytic growth. According to one embodiment, the electrically conducting layer 120 is deposited onto the dielectric layer 105.

Optionally, prior to the step of forming the electrically conducting layer 120, a step of forming a bonding layer 110, on the dielectric layer 105, is executed. The bonding layer 110 advantageously comprises a material selected among titanium (Ti), titanium nitride (TiN), Tungsten-Titanium titanate (TiW), or a bilayer of tantalum/Tantalum nitride (TaN/Ta). The bonding layer 110 extends on a thickness advantageously ranging from 10 nanometers to 500 nanometers for the above mentioned exemplary via.

A step is executed next consisting of forming the electrically resistive layer 130 (or upper layer 130) on the electrically conducting layer 120. The electrically resistive layer 130 can, particularly advantageously, be deposited on a material selected among copper (Cu), gold (Au) or chromium (Cr). It is preferably compatible with a step of chemical-mechanical polishing. Advantageously, the electrically resistive layer 130 has a higher resistivity than that of the electrically conducting layer 120. For example, the electrically conducting copper layer 120 has a resistivity of approximately $20.10^{-9}$ Ohm/m whereas the electrically resistive titanium layer 130 has a minimum resistivity of approximately $400.10^{-9}$ Ohm/m, at a temperature of 300K. According to one embodiment, the electrically resistive layer 130 may be a dielectric and thus have an almost infinite resistivity (ex: $10^{17}$ Ohm/m for glass), i.e. a factor 20 or more.

The electrically resistive layer 130 preferably has the advantage of being able to be selectively chemically etched as compared to the electrically conducting layer 120. According to one preferred embodiment, the electrically resistive layer 130 comprises a metallic material, for example, based on titanium (Ti), titanium nitride (TiN), tantalum (Ta), tantalum nitride (TaN) or tungsten titanate (TiW). According to an alternative solution, the electrically resistive layer 130 comprises a dielectric material. This material is, for example, silicium nitride (SiN). The electrically resistive layer 130 is preferably formed by a chemical vapor deposition (CVD), or by a Plasma-Enhanced Chemical Vapor Deposition (or PECVD). The electrically resistive layer 130 advantageously extends on a thickness ranging from 10 nanometers to 1 micron according to the exemplary via mentioned above.

In one embodiment illustrated in FIG. 11a, the step of forming the electrically resistive layer 130 is so configured that the thickness of said electrically resistive layer 130 is strictly smaller than the height h of the protruding conducting element 100, upon completion of the embossing of said conducting element 100 and so that the sum of the thicknesses of the stack of layers 120, 130 is smaller than the height h of the protruding conducting element 100. According to another preferred embodiment illustrated in FIG. 11b, the step of forming the electrically resistive layer 130 is so configured that the thickness of said electrically resistive layer 130 is strictly smaller than the height h of the protruding conducting element 100, upon completion of the embossing of said conducting element 100 and so that the sum of the thicknesses of the stack of layers 120, 130 is strictly higher than the height h of the protruding conducting element 100. According to an exemplary embodiment, the height h of the protruding conducting element 100 is approximately 500 nanometers, the thickness of the bonding layer 110 approximately 100 nanometers, the thickness of the electrically conducting layer 120 is approximately 400 nanometers and the thickness of the electrically resistive layer 130 is approximately 300 nanometers.

Figure 12A:
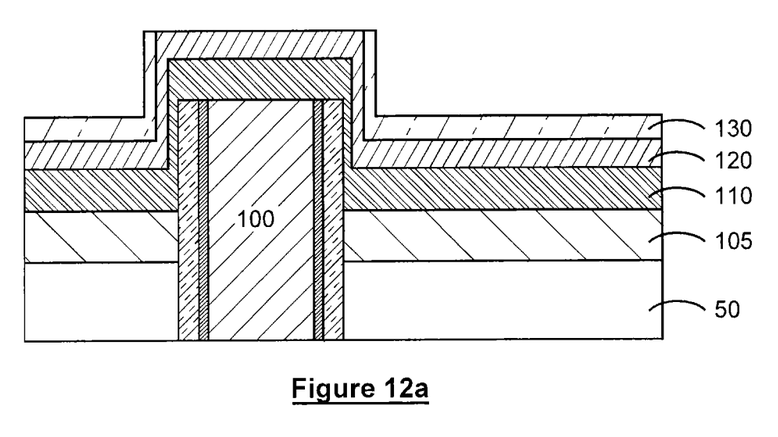
FIGS. 12a and 12b illustrate a step of partially removing the electrically resistive layer so as to reveal one access to the electrically conducting layer, located above the protruding conducting element.
Figure 12B:
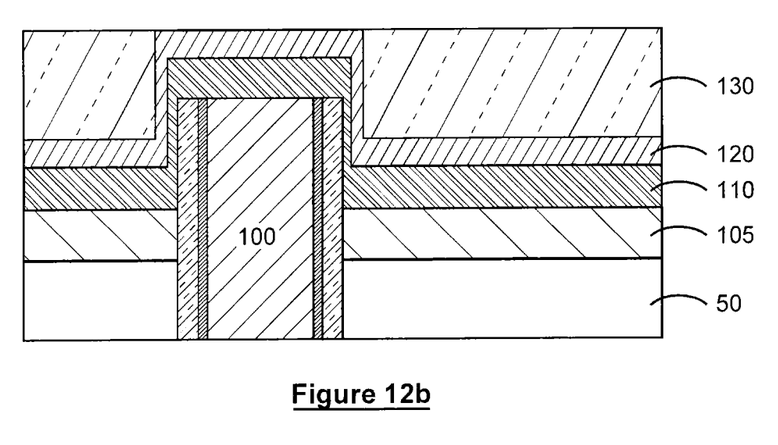

FIGS. 12a and 12b illustrate the steps of partially stripping the electrically resistive layer 130, above the protruding conducting element 100. The step of stripping preferably comprises the polishing of a portion of the electrically resistive layer 130, which enables to reveal an access to the electrically conducting layer 120, located above the protruding conducting element 100. Polishing means any mechanical thinning, inclusive of grinding or chemical-mechanical polishing. Such step of stripping is advantageously so configured as to thin a layer or to strip a thickness of said layer. Particularly advantageously, the embossing of the conducting element 100 creates a local protrusion on the surface enabling the polishing to eliminate the material of the electrically resistive layer 130 only above the conducting element 100. The step of partially stripping the electrically resistive layer 130 has the advantage of creating an access to the electrically conducting layer 120, having a higher conductivity than the electrically resistive layer 130.

FIG. 12a illustrates one embodiment wherein the step of partially stripping the resistive layer 130 stops as soon as the electrically conducting layer 120 is reached. According to a preferred embodiment illustrated in FIG. 12b the step of partially stripping the resistive layer 130 stops as soon as an increase in the resisting torque is detected. In this particular case, the mechanical action of the mechanical-chemical polishing makes it possible to polish, in protrusion, the material of the electrically resistive layer 130, since the reveal ratio is very low (less than 1%); with the reveal ratio corresponding to the protruding surface divided by the total surface of the wafer. When the protrusions are polished, the material forming the electrically resistive layer 130 then represents almost the whole surface of the wafer, and the polishing speed then becomes very low. The electrically resistive layer 130 becomes a layer for stopping the step of chemical-mechanical polishing. This advantageously gives a better uniformity to the wafer.

Figure 13A:
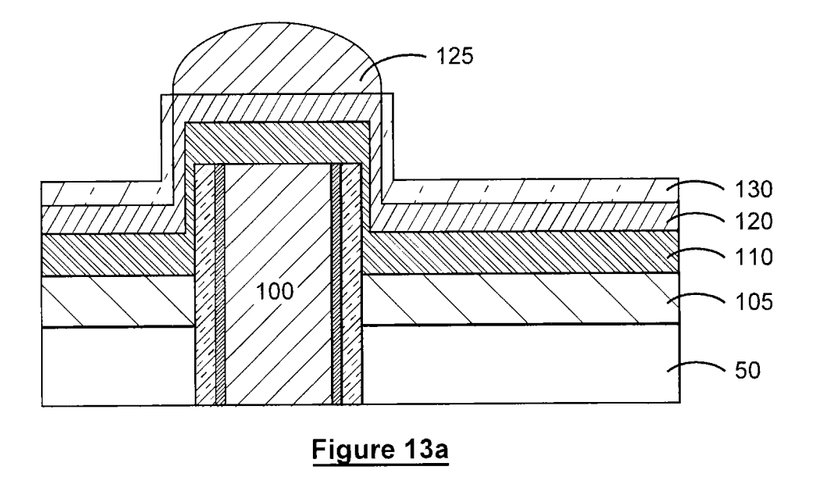
FIGS. 13a and 13b illustrate a step of electrolytic growth upon completion of which a conducting pad is formed from the electrically conducting layer above the conducting element.
Figure 13B:
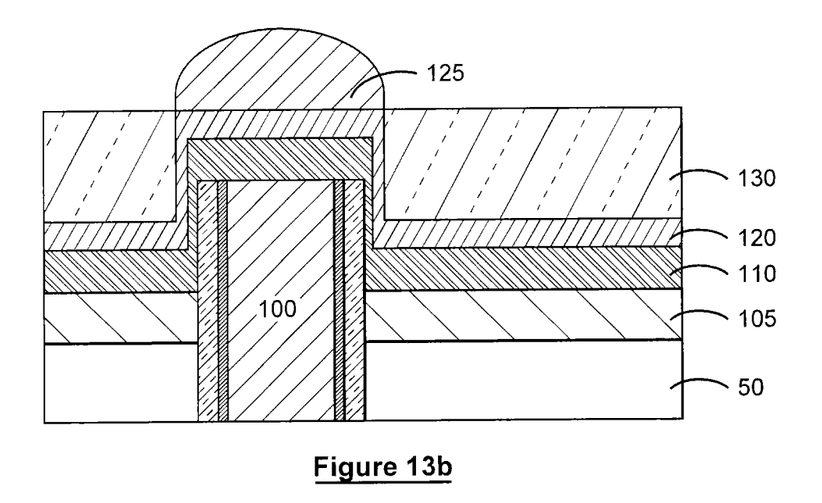

As soon as at least an access to the electrically conducting layer 120 is locally revealed above at least a conducting element 100, it is advantageously possible to execute an electrolytic growth from the electrically conducting layer 120, as illustrated in FIGS. 13a and 13b. Such step of electrolytic growth has the advantage of not using any mask. Particularly advantageously, the difference in conductivity between the material of the electrically resistive layer 130 (very resistive) and the electrically conducting layer 120 (not very resistive) enables the electrolyte to deposit only and selectively onto the electrically conducting layer 120. For example, the conductivity ratio between these two layers is approximately 20, as mentioned above, relative to resistivity. The electrolytic growth occurs from the electrically conducting layer 120, preferably in any direction. The step of electrolytic growth forms an interconnection pad 125, preferably having a rounded shape, above the conducting element 100.

Figure 14:
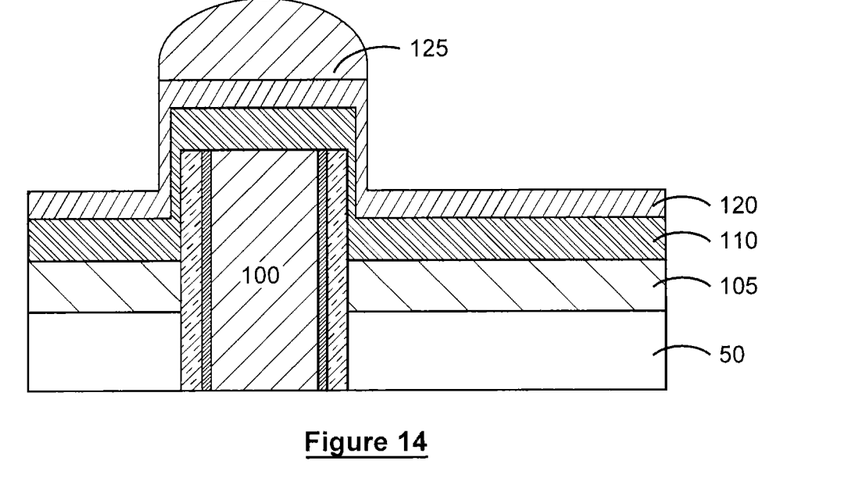
FIG. 14 illustrates a step of removing the electrically resistive layer.

FIG. 14 illustrates the step of stripping the electrically resistive layer 130. Advantageously, such step comprises etching. Preferably, the etching is isotropic. According to one embodiment wherein the electrically resistive layer 130 is formed in a titanium (Ti) based material and wherein the electrically conducting layer 120 is made of a copper (Cu) based material, the step of stripping the electrically resistive layer 130 comprises chemical etching, executed with hydrofluoric acid (HF). According to an alternative solution wherein the electrically resistive layer 130 is formed in a Silicon nitride (SiN) based material, the step of stripping the electrically resistive layer 130 comprises chemical etching, executed with phosphoric acid ($H_3PO_4$).

Figure 15:
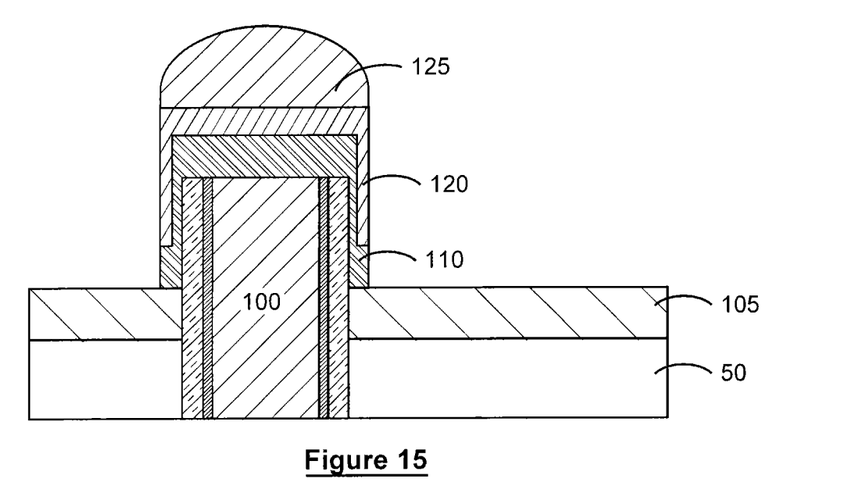
FIG. 15 illustrates a step of removing the electrically conducting layer and, optionally a step of removing the bonding layer.

FIG. 15 illustrates the step of stripping the electrically conducting layer 120. Advantageously, the step of stripping the electrically conducting layer 120 comprises etching. Such etching is preferably anisotropic.

Optionally, when a bonding layer 110 is formed on the dielectric layer 105, prior to the forming of the electrically conducting layer 120, a step of stripping the bonding layer 110 is executed. Preferably, the step of stripping the bonding layer 110 comprises etching. Such etching is preferably anisotropic.

The step of embossing the conducting element 100 makes it possible to create a protrusion from said conducting element 100. This protrusion is then used during the step of partially stripping the electrically resistive layer 130, to reveal accesses to the electrically conducting layer 120, located above the conducting element 100, and thus make an interconnection pad 125 on the conducting element 100 using electrolytic growth without a mask. Advantageously, the conducting element 100 keeps on the flanks thereof, including on its exposed part, at least one among the layer acting as a diffusion barrier 101 and the insulating layer 102.

The present invention thus provides a method making it possible to save, and more particularly to omit a step of lithography while gaining alignment accuracy. This method is also compatible with the reduction in the dimensions of conducting elements or through vias and associated interconnection pads. Besides, the rounded shape of the interconnection pads is advantageous for die bonding methods (for example, of the WLUF type for <<Wafer Level UnderFill>>). Besides, as the positioning constraints relative to a step of alignment are avoided, the invention enables to reduce the cost of the required equipment and thus the production cost of conducting pads.

Another aspect of the invention relates to a micro-electronic device comprising an interconnection pad. More particularly, a non restricting aspect of the invention relates to a micro-electronic device comprising a conducting element 100 with at least one among the layer acting as a diffusion barrier 101 and an insulating layer 102. Advantageously, at least one among the layer acting as a diffusion barrier 101 and the insulating layer 102 is flush with the edge of said conducting element 100. In other words, in this case, one of the layers 101, 102 or both extend(s) up to the end of the conducting element, up to the height level of the upper face of this element. The protruding portion of the conducting element is thus reinforced during the steps of production of a conducting pad.

The present invention is not limited to the above mentioned embodiments, but extends to any embodiment complying with the spirit thereof.

The invention claimed is:

1. A method for producing at least one interconnection pad on a conducting element comprising an upper face and a side wall, the method being executed from a substrate at least an upper face of which is electrically insulating, the conducting element extending through a portion of the substrate, the method comprising the sequence of the following steps:
    a step of embossing the conducting element, so configured as to form a protrusion of the conducting element that protrudes beyond the upper face of the substrate;
    a step of forming, above the upper face of the substrate, a stack of layers comprising successively at least one electrically conducting layer and one electrically resistive layer, with said electrically resistive layer having a higher resistivity than that of the electrically conducting layer;
    a step of partially removing the electrically resistive layer, so configured as to expose at least a top portion of the at least one electrically conducting layer, said portion being positioned above the protrusion of the conducting element, said step comprising polishing said electrically resistive layer, while preserving said electrically resistive layer around the exposed top portion of the at least one electrically conducting layer; and
    a step of electrolytic growth from said exposed top portion of the at least one electrically conducting layer, said exposed top portion being configured to seed said electrolytic growth, so as to form said at least one interconnection pad on said conducting element.

2. The method according to claim 1, wherein the substrate is selected among an insulating substrate or a substrate comprising a dielectric layer on the surface.

3. The method according to claim 1, wherein the step of embossing the conducting element comprises an etching, so configured as to remove a thickness of a portion of the substrate corresponding to a height h of the protrusion of the conducting element.

4. The method according to claim 1, wherein the step of forming the stack of layers is so configured that the thickness of the electrically resistive layer is smaller than the height h of the protrusion of the conducting element.

5. The method according to claim 4, wherein the step of forming the stack of layers is so configured that the thickness of said stack of layers is higher than the height h of the protrusion of the conducting element.

6. The method according to claim 5, wherein the step of partially removing the electrically resistive layer is self-limited by a detection of an increase in a resisting torque.

7. The method according to claim 1, comprising a step of complete removal of the electrically resistive layer, upon completion of the step of electrolytic growth.

8. The method according to claim 7, wherein the step of complete removal of the electrically resistive layer comprises an etching.

9. The method according to claim 7, comprising a step of removing the electrically conducting layer, upon completion of the step of complete removal of the electrically resistive layer.

10. The method according to claim 9, wherein the step of removing the electrically conducting layer comprises an etching.

11. The method according to claim 9, wherein the stack of layers further comprises a bonding layer, with said bonding layer being formed on the upper face of the substrate prior to the step of forming the electrically conducting layer, and further comprising a step of removing the bonding layer upon completion of the step of removing the electrically conducting layer.

12. The method according to claim 11, wherein the step of removing the bonding layer comprises an etching.

13. The method according to claim 1, wherein the stack of layers further comprises a bonding layer, with said bonding layer being formed on the upper face of the substrate prior to the step of forming the electrically conducting layer.

14. The method according to claim 1, wherein the conducting element is surrounded by at least one layer among a diffusion barrier layer and an insulating layer, with the step of embossing the conducting element being so configured as to preserve said at least one layer among the diffusion barrier layer and the insulating layer in the protrusion of the conducting element.

15. A device comprising at least one interconnection pad obtained with the method according to claim 1.

* * * * *